United States Patent
Kayukawa et al.

(10) Patent No.: US 7,579,212 B2
(45) Date of Patent: Aug. 25, 2009

(54) SEMICONDUCTOR DEVICE HAVING TIN-BASED SOLDER LAYER AND METHOD FOR MANUFACTURING THE SAME

(75) Inventors: Kimiharu Kayukawa, Nisshin (JP); Akira Tanahashi, Okazaki (JP); Chikage Noritake, Ama-gun (JP); Shoji Miura, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 241 days.

(21) Appl. No.: 11/707,961

(22) Filed: Feb. 20, 2007

(65) Prior Publication Data

US 2007/0176293 A1 Aug. 2, 2007

Related U.S. Application Data

(62) Division of application No. 11/220,979, filed on Sep. 8, 2005, now Pat. No. 7,361,996.

(30) Foreign Application Priority Data

Sep. 8, 2004 (JP) .............................. 2004-261425
Dec. 20, 2004 (JP) .............................. 2004-368114

(51) Int. Cl.
*H01L 21/00* (2006.01)
(52) U.S. Cl. ...................... 438/106; 257/780
(58) Field of Classification Search ................ 438/123, 438/106; 228/123.1; 257/734, 780
See application file for complete search history.

(56) References Cited

U.S. PATENT DOCUMENTS

| 3,741,880 | A |  | 6/1973 | Shiba et al. |
| 4,954,870 | A | * | 9/1990 | Takemura et al. ........... 257/673 |
| 5,731,635 | A |  | 3/1998 | Bareither et al. |
| 6,515,372 | B1 |  | 2/2003 | Narizuka et al. |
| 6,805,974 | B2 | * | 10/2004 | Choi et al. ................... 428/646 |
| 2001/0019882 | A1 | * | 9/2001 | Jiang .......................... 438/584 |
| 2002/0093096 | A1 |  | 7/2002 | Tago et al. |
| 2004/0211665 | A1 | * | 10/2004 | Yoon et al. ............. 204/298.01 |
| 2004/0232429 | A1 |  | 11/2004 | Miki et al. |

FOREIGN PATENT DOCUMENTS

JP A-52-147064 12/1977

(Continued)

OTHER PUBLICATIONS

Ng, Kwok K., *Complete Guide to Semiconductor Devices*, Second Edition, John Wiley and Sons, Inc., 2005, Appendix B2 p. 600.

(Continued)

*Primary Examiner*—W. David Coleman
*Assistant Examiner*—Daniel Shook
(74) *Attorney, Agent, or Firm*—Posz Law Group, PLC

(57) ABSTRACT

A semiconductor device includes: a semiconductor substrate; a base member; a tin-based solder layer; a first metal layer; and a first alloy layer. The semiconductor substrate is bonded to the base member through the first metal layer, the first alloy layer and the tin-based solder layer in this order. The first alloy layer is made of a first metal in the first metal layer and tin in the tin-based solder layer. The first metal layer is made of at least one of material selected from the group consisting of titanium, aluminum, iron, molybdenum, chromium, vanadium and iron-nickel-chromium alloy.

16 Claims, 8 Drawing Sheets

FOREIGN PATENT DOCUMENTS

| | | |
|---|---|---|
| JP | 58-182840 | 10/1983 |
| JP | A-62-163335 | 7/1987 |
| JP | A-5-160533 | 6/1993 |
| JP | A-6-244226 | 9/1994 |
| JP | A-2000-100846 | 4/2000 |
| JP | A-2001-77049 | 3/2001 |
| JP | A-2003-152007 | 5/2003 |
| JP | A-2003-347487 | 12/2003 |
| JP | A-2005-37239 | 2/2005 |

OTHER PUBLICATIONS

United States Office Action from the USPTO dated Aug. 6, 2007 in the parent U.S. Appl. No. 11/220,979.

Chinese Office Action issued from the Chinese Patent Office dated Jul. 6, 2007 in the corresponding Chinese application No. 200510099909.8 (and English translation).

Office Action from U.S. Patent Office issued on Mar. 13, 2007 for the corresponding U.S. Appl. No. 11/220,979.

Materials Database Station and National Institute for Materials Science, "Technique for Soldering Process," Table 5.2, Note (b), (Feb. 28, 1981), pp. 130-133 (and Partial English Translation of Note(b) of Table 5.2).

Materials Database Station and National Institute for Materials Science, "Soldering Technique for Electronic Material," Fig. 3.3, (Sep. 5, 1983), pp. 41-43, 318 (and Partial English Translation of text from Figure 3.3).

* cited by examiner

SEMICONDUCTOR DEVICE HAVING TIN-BASED SOLDER LAYER AND METHOD FOR MANUFACTURING THE SAME

CROSS REFERENCE TO RELATED APPLICATIONS

This application is a division of application Ser. No. 11/220,979 filed on Sep. 8, 2005, which is based on Japanese Patent Applications No. 2004-261425 filed on Sep. 8, 2004, and No. 2004-368114 filed on Dec. 20, 2004, the disclosures of which are incorporated herein by reference.

FIELD OF THE INVENTION

The present invention relates to a semiconductor device having a tin-based solder layer and a method for manufacturing the same.

BACKGROUND OF THE INVENTION

Conventionally, lead-tin alloy (Pb—Sn alloy) solder is used for bonding a semiconductor substrate such as an IC chip having a semiconductor device to a base member such as a heat sink and a lead frame. However, in view of environmental protection such as safety and low harmfulness, it is required to use Pb free solder or low Pb contained solder. One of Pb free solders is a tin-based solder.

Japanese Patent Application Publication No. 2003-347487 discloses that a backside of a semiconductor substrate is bonded to a base member with a tin-based solder. The substrate includes a backside electrode. The electrode is composed of a titanium layer, a nickel layer and a gold or a silver layer, which are stacked on the substrate in this order. The base member is a heat radiation member. The substrate is mounted on the heat radiation member with the tin-base solder. The tin-based solder is made of gold and tin alloy so that the solder provides a low melting solder.

The above semiconductor device is manufactured as follows. Firstly, the backside of the substrate is polished and cleaned. Then, the backside electrode is formed on the polished surface of the substrate. Then, the tin-based solder is sandwiched between the heat radiation member and the backside electrode. Then, the tin-based solder is heated up to a solidus temperature of the solder. Thus, the solder is reflowed so that the substrate is soldered on the heat radiation member.

In this structure of the backside electrode, the Ti layer provides adhesiveness and ohmic contact of a semiconductor substrate made of silicon. The Ni layer provides bonding property of the solder by alloying the Ni layer and tin in the solder. Thus, the substrate and the base member are electrically, thermally and mechanically bonded with the solder.

Here, a passive film such as an oxide film is easily formed on the Ti layer, and it is difficult to remove. The passive film is formed in atmosphere having ordinary temperature and ordinary pressure. Therefore, it is difficult to directly bond the Ti layer to the solder. Thus, it is required to form the Ni layer on the Ti layer sufficiently thickly. Further, it is required to control a soldering condition with high accuracy. Therefore, a manufacturing cost becomes higher.

SUMMARY OF THE INVENTION

In view of the above-described problem, it is an object of the present invention to provide a semiconductor device having a tin-based solder layer. It is another object of the present invention to provide a method for manufacturing a semiconductor device having a tin-based solder layer.

A semiconductor device includes: a semiconductor substrate; a base member; a tin-based solder layer; a first metal layer; and a first alloy layer. The semiconductor substrate is bonded to the base member through the first metal layer, the first alloy layer and the tin-based solder layer in this order. The first alloy layer is made of a first metal in the first metal layer and tin in the tin-based solder layer. The first metal layer is made of at least one of material selected from the group consisting of titanium, aluminum, iron, molybdenum, chromium, vanadium and iron-nickel-chromium alloy.

In the device, by using the tin-based solder layer and the minimum number of the metal layers, the backside of the substrate is soldered to the base member. Thus, the manufacturing process becomes simple and the manufacturing cost of the device becomes lower.

Further, a method for manufacturing a semiconductor device is provided. The device includes a semiconductor substrate and a base member bonded to the substrate with a tin-based solder layer. The method includes the steps of: forming a first metal layer on the substrate; forming a second metal layer on the first metal layer; stacking the substrate on the base member through the solder layer, wherein the solder layer is disposed between the base member and the second metal layer; and heating the substrate with the base member so that the second metal layer is diffused into the solder layer and that the first metal layer and the solder layer are reacted to form a first alloy layer. The first alloy layer is made of a first metal in the first metal layer and tin in the solder layer. The first alloy layer is disposed between the first metal layer and the solder layer. The first metal layer is made of at least one of material selected from the group consisting of titanium, aluminum, iron, molybdenum, chromium, vanadium and iron-nickel-chromium alloy. The second metal layer has an initial thickness in a range between 50 nm and 750 nm before the step of heating.

By using the tin-based solder layer and the minimum number of the metal layers, the backside of the substrate is soldered to the base member. Thus, the manufacturing process becomes simple and the manufacturing cost of the device becomes lower.

Preferably, the method further includes the step of: heating the substrate with the first and the second metal layers so that an intermediate alloy layer is formed between the first and the second metal layers. The intermediate alloy layer is made of a first metal in the first metal layer and a second metal in the second metal layer. In the step of heating the substrate with the base member, the intermediate alloy layer, the first metal layer and the solder layer are reacted to form a second alloy layer so that the first alloy layer becomes the second alloy layer. The second alloy layer is made of the second metal in the second metal layer, the first metal in the first metal layer and the tin in the solder layer. The second alloy layer is disposed between the first metal layer and the solder layer.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
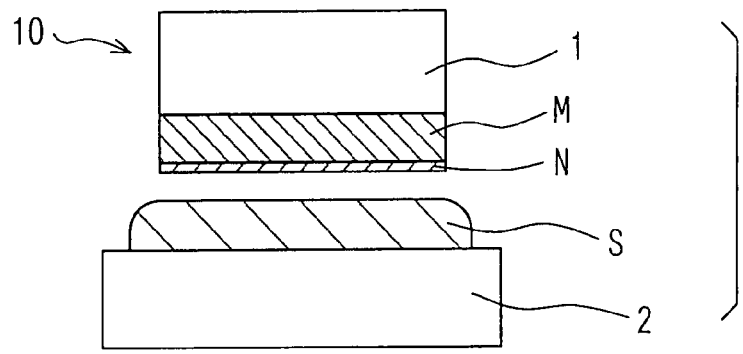
FIGS. 1A and 1B are schematic cross sectional views explaining a method for manufacturing a semiconductor device according to a first embodiment of the present invention.
Figure 1B:
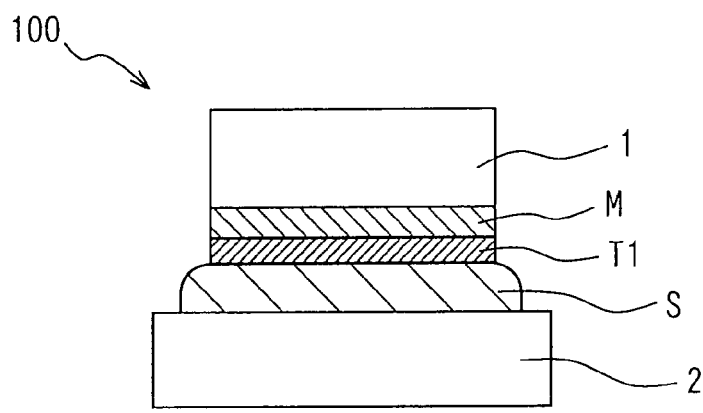

A semiconductor device 100 according to a first embodiment of the present invention is shown in FIGS. 1A and 1B. FIG. 1A shows the device 100 before heat treatment, i.e., before soldering, and FIG. 1B shows the device 100 after heat treatment, i.e., after soldering.

The device 100 includes a semiconductor substrate 1 and a base member 2. The substrate 1 has an electric part such as a power transistor formed on a foreside of the substrate 1. The backside of the substrate 1, which is opposite to the semiconductor part, is bonded on the base member 2 with a tin-based solder layer S. The base member 2 is, for example, a heat sink, a lead frame or a circuit board. The device 100 is manufactured as follows.

Firstly, the electric part is formed on the foreside of the substrate 1. The first metal layer M and the second metal layer N are formed on the backside of the substrate 1 in this order. Thus, a semiconductor chip 10 is formed. Then, the chip 10 is mounted on the base member 2 through the solder layer S, which is sandwiched between the base member 2 and the second metal layer N of the chip 10. Thus, a stacked structure composing the chip 10 and the base member 2 is prepared. The stacked structure is heated so that the second metal layer is diffused into the solder layer S. Further, the first metal layer M and the solder layer S are directly reacted so that an alloy layer T1 is formed between the first metal layer M and the solder layer S. The alloy layer T1 is made of alloy of the first metal layer M and the solder layer S. Specifically, the alloy layer T1 is made of the first metal in the first metal layer M and tin in the solder layer S. After soldering, the device 100 is composed of the substrate 1, the first metal layer M, the alloy layer T1, the solder layer S and the base member 2. Here, the alloy layer T1 works as a bonding layer between the chip 10 and the base member 2. Although the first metal layer M is directly formed on the substrate 1, another metal layer or an insulation layer can be formed between the substrate 1 and the first metal layer M.

In the device 100, the backside of the substrate 1 is bonded to the base member 2 by using the minimum number of the metal layers and the tin-based solder layer S. Therefore, a manufacturing process of the device 100 is simple, and a manufacturing cost of the device 100 is low.

The first metal in the first metal layer M is, for example, titanium (i.e., Ti), aluminum (i.e., Al), iron (i.e., Fe), molybdenum (i.e., Mo), chromium (i.e., Cr), vanadium (i.e., V) or iron-nickel-chromium alloy (i.e., Fe—Ni—Cr alloy). The first metal has excellent bonding property and excellent ohmic contact with a silicon substrate. Further, the first metal forms alloy with tin in the solder layer S. It is preferred that the first metal is made of Ti. Ti is a conventional material as a metallization material of silicon in the semiconductor substrate. Therefore, Ti has excellent bonding property and excellent ohmic contact with the silicon substrate. However, a passive film such as an oxide film is easily formed on a Ti film. Thus, in general, it is difficult to bond a Ti layer to the solder layer directly. However, in the above device 100, the second metal layer N is formed on the first metal layer M so that the second metal layer N works as a sacrifice layer for soldering. Thus, the alloy layer T1 is formed between the first metal layer M and the solder layer S. The alloy layer T1 has sufficiently strong bonding property.

The thickness of the alloy layer T1 is preferably equal to or thicker than 3 nm. More preferably, the thickness of the alloy layer T1 is equal to or thicker than 10 nm. When the average thickness of the alloy layer T1 is equal to or larger than 10 nm, and the minimum thickness of the alloy layer T1 at the interface between the first metal layer M and the solder layer S is equal to or larger than 3 nm, sufficiently strong bonding property is obtained. Further, when the thickness of the alloy layer T1 is larger than 10 nm, almost the same bonding property as the case where the average thickness is equal to 10 nm is obtained.

The second metal layer N is a thin film layer for protecting a surface of the first metal layer M from forming the passive film on the surface of the first metal layer M. The second metal layer N can be diffused into the solder layer S by the heat treatment of soldering so that the second metal layer N is disappeared after soldering. Thus, the thickness of the second metal layer N can be easily controlled. Further, the soldering condition of the device 100 is easily controlled. Thus, the manufacturing cost of the device 100 becomes comparatively low.

The thickness of the second metal layer N is preferably in a range between 50 nm and 750 nm, as described below. When the thickness of the second metal layer N is smaller than 50 nm, the second metal layer N may not sufficiently protect the first metal layer M from oxidizing the surface of the first metal layer M, i.e., from forming the passive film on the surface of the first metal layer M. Therefore, in this case, the solder-wettability of the solder layer S becomes smaller during the heat treatment, so that the bonding strength between the substrate 1 and the base member 2 becomes low. When the thickness of the second metal layer N is larger than 50 nm, the bonding strength between the substrate 1 and the base member 2 becomes strong and constant. When the thickness of the second metal layer N is larger than 750 nm, the second metal layer N remains after soldering. Therefore, excess second metal layer may increase the manufacturing cost of the device 100.

It is preferred that the first and the second metal layers M, N are formed serially in a vacuum chamber by using a physical vapor deposition (i.e., PVD) method such as a vacuum evaporation method and a sputtering method. Further, it is preferred that the degree of vacuum before deposition is equal to or smaller than $5 \times 10^{-4}$ Pa. This is because the surface of the first metal layer M is prevented from oxidizing.

Figure 6A:
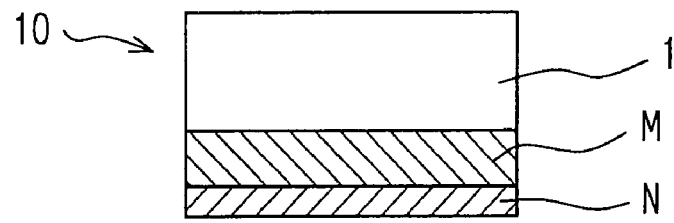
FIGS. 6A to 6C are schematic cross sectional views explaining a method for manufacturing a semiconductor device according to a second embodiment of the present invention.
Figure 6B:
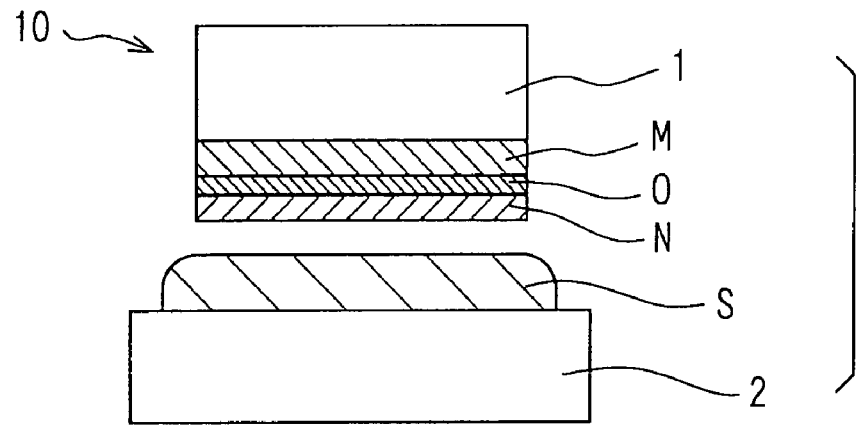

The second metal in the second metal layer N can be made of any metal. It is preferred that the second metal is nickel (i.e., Ni), copper (i.e., Cu), silver (i.e., Ag), gold (i.e., Au), platinum (i.e., Pt), silver-platinum (i.e., Ag—Pt) alloy, silver-palladium (i.e., Ag—Pd) alloy or palladium (i.e., Pd). More preferably, the second metal is nickel or gold. These second metals can form alloy with the first metal in the first metal layer M or tin in the solder layer S. The second metal layer N can be composed of a multi-layered film, which is made of the above metals. The second metal can be diffused into the solder layer S in the heat treatment process, i.e., in the soldering process. Further, the second metal can be involved into the alloy layer T1 so that the alloy layer becomes the second alloy layer T2, as shown in FIGS. 6A and 6B.

The tin-based solder layer S can be made of Pb-free solder, which does not include lead (i.e., Pb). Thus, the device 100 can be manufactured with harmless and safety, so that environmental protection is obtained. It is preferred that the mass content of tin in the solder layer S is equal to or larger than 95 wt. %. It is preferred that the solder layer S is made of tin (i.e., Sn), tin-copper (i.e., Sn—Cu) alloy, tin-silver-copper (i.e., Sn—Ag—Cu) alloy, tin-copper-nickel (i.e., Sn—Cu—Ni) alloy, tin-antimony (i.e., Sn—Sb) alloy, tin-indium (i.e., Sn—In) alloy, or tin-zinc (i.e., Sn—Zn) alloy. More preferably, the solder layer S is made of pure Sn, Sn-(0.7 wt. % Cu) alloy, Sn-(3.5 wt. % Ag) alloy, Sn-(1 wt. % to 3.9 wt. % Ag)-(0.3 wt. % to 1.5 wt. % Cu) alloy, or Sn-(0.7 wt. % Cu)-(0.06 wt. % Ni) alloy. Preferably, the solder layer S can include additives such as phosphorous (i.e., P) and germanium (i.e., Ge).

Next, the device 100 is manufactured, for example, as follows.

Firstly, a Ti film having the thickness of 250 nm is formed on the backside of the substrate 1 so that the first metal layer M is formed on the substrate 1. Then, the second metal layer N composed of a Ni film having the thickness in a range between 50 nm and 1000 nm and an Au film having the thickness of 50 nm is formed on the first metal layer M. Here, the second metal layer N is made of a multi-layered film. Next, the solder layer S made of (99.24 wt. % Sn)-(0.7 wt. % Cu)-(0.06 wt. % Ni) alloy is formed on the base member 2. The base member 2 is made of metal. The semiconductor chip 10 including the substrate 1 with the first and the second metal layers M, N is mounted on the base member 2 through the solder layer S. Then, the chip 10 with the base member 2 is mounted in a hydrogen reduction atmospherical furnace. In the furnace, the chip 10 with the base member 2 is heated up to 270° C., which is higher than the solidus temperature of the solder layer S. Here, the solidus temperature is about 220° C. Thus, the chip 10 with the base member 2 is heated up to the peak temperature of 270° C. during 20 seconds so that the solder layer S is reflowed. In this heat treatment process, i.e., in this soldering process, the chip 10 is soldered on the base member 2.

The cross section of the device 100 after soldering is studied. As a result, when the thickness of the Ni film is equal to or smaller than 750 nm, the second metal layer N composed of the Ni film and the Au film is diffused into the solder layer S so that the first alloy layer T1 composed of Ti and Sn is formed. However, when the thickness of the Ni film is larger than 750 nm, the Ni film in the second metal layer N remains. This unreacted Ni film does not contribute to the bonding between the chip 10 and the base member 2. Accordingly, to reduce the manufacturing cost of the device 100, it is preferred that the thickness of the Ni film is equal to or smaller than 750 nm.

Figure 2:
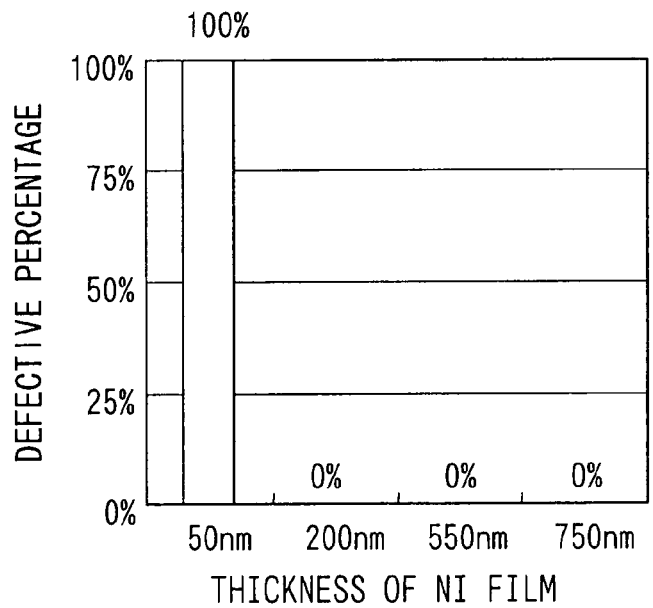
FIG. 2 is a graph showing defective percentage of the device having different thickness of a Ni film, according to the first embodiment.
Figure 3:
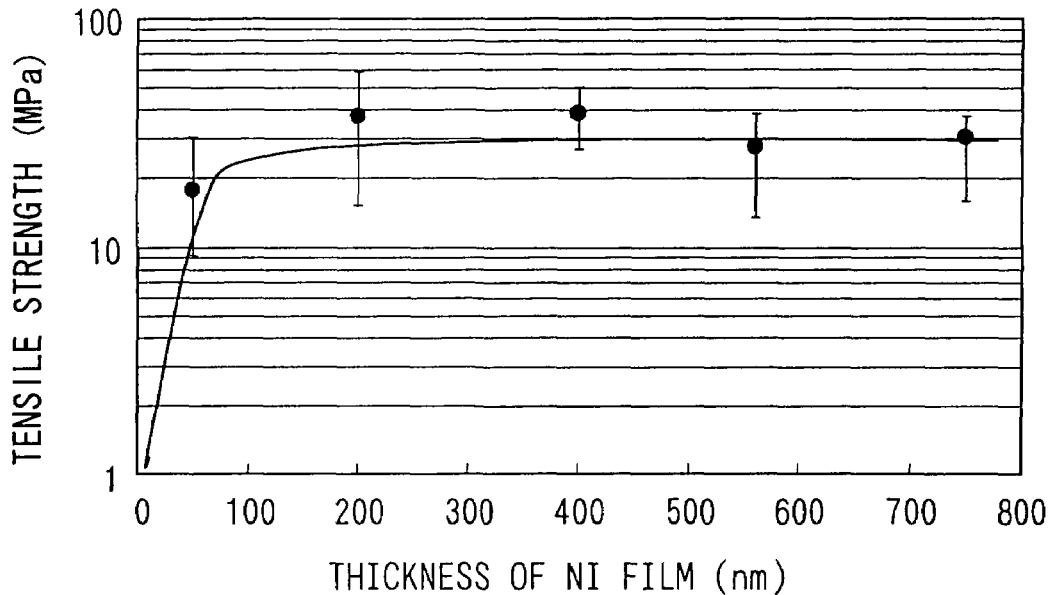
FIG. 3 is a graph showing tensile strength of the device having different thickness of the Ni film, according to the first embodiment.

FIG. 2 shows defective percentage of the device 100 having different thickness of the Ni film. The defect of the device 100 is caused by defective solder wetting. FIG. 3 shows tensile strength of the device 100 having different thickness of the Ni film. Here, ten samples of the device 100 in each thickness of the Ni film are studied.

As shown in FIGS. 2 and 3, when the thickness of the Ni film is 50 nm, the defective solder wetting is occurred with 100%. Thus, the bonding strength between the substrate 1 and the base member 2 is weak. This is because the thickness of the Ni film is thin so that the second metal layer N cannot protect the first metal layer M from oxidizing. In this case, the surface of the Ti film of the first metal layer M is oxidized. Accordingly, it is required for the Ni film to becomes thicker than 50 nm to prevent the Ti film from oxidizing. When the thickness of the Ni film is larger than 50 nm, the sufficiently strong bonding strength is obtained.

Figure 4:
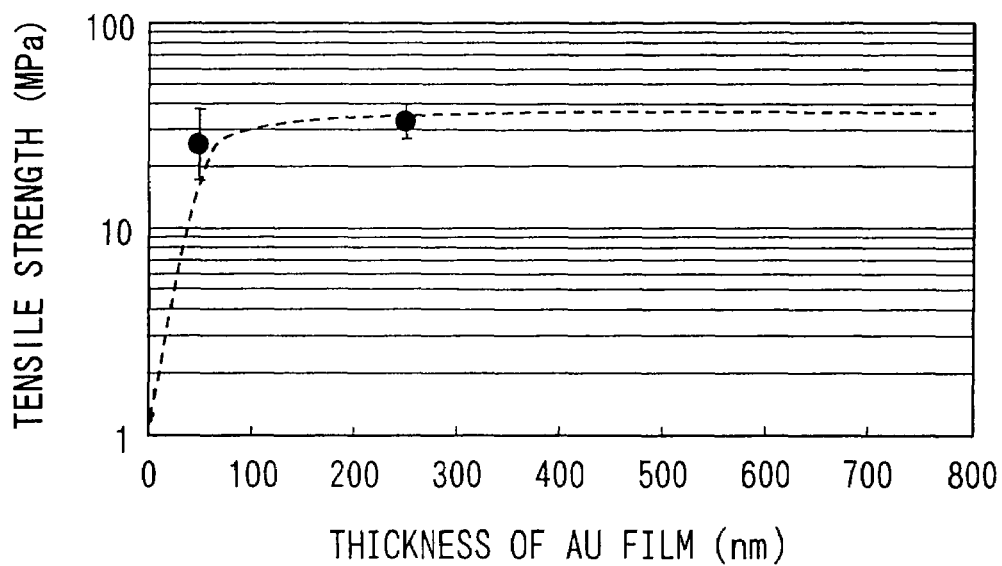
FIG. 4 is a graph showing tensile strength of the device having different thickness of an Au film, according to the first embodiment.

FIG. 4 shows tensile strength of the device 100 having different thickness of the Au film. In this case, the second metal layer N of the device 100 is composed of only an Au film. Therefore, the Ni film is not formed in the second metal layer N. Here, ten samples of the device 100 in each thickness of the Au film are studied. When the thickness of the Au film is 50 nm, the defective solder wetting is occurred. However, when the thickness of the Au film is larger than 50 nm, the sufficiently strong bonding strength is obtained.

Figure 5:
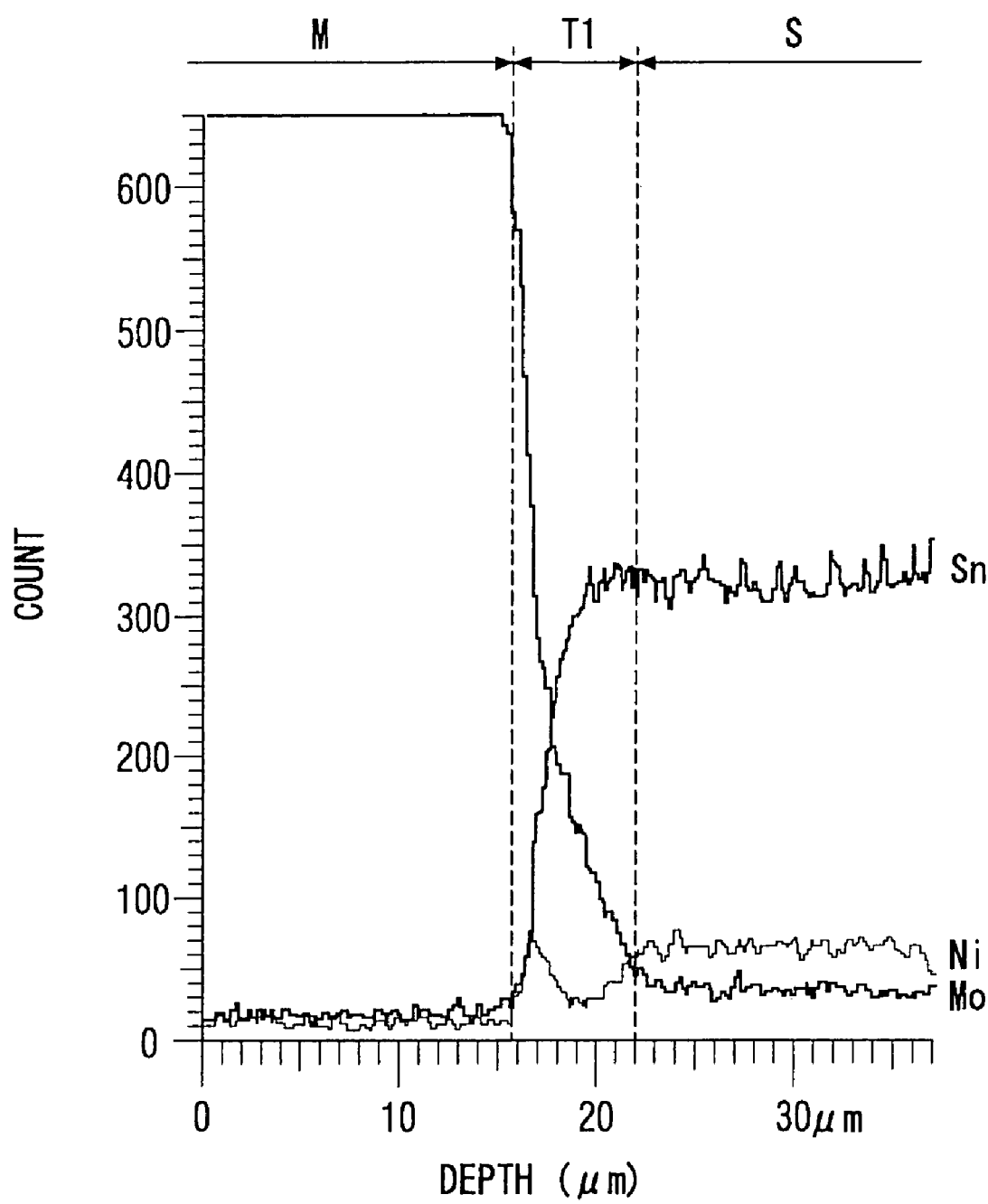
FIG. 5 is a depth profile of elemental analysis, according to the first embodiment.

FIG. 5 shows a result of elemental analysis of the cross section of a bonding layer in the device 100. In this case, the device 100 has the first metal layer M made of molybdenum (i.e., Mo) and the second metal layer N made of Ni. The elemental analysis is performed in a thickness direction. Thus, FIG. 5 shows a depth profile of the elemental analysis. As shown in FIG. 5, Ni in the second metal layer N is diffused into the solder layer S so that the first alloy layer Ti composed of Mo—Sn alloy is formed.

Second Embodiment

Figure 6C:
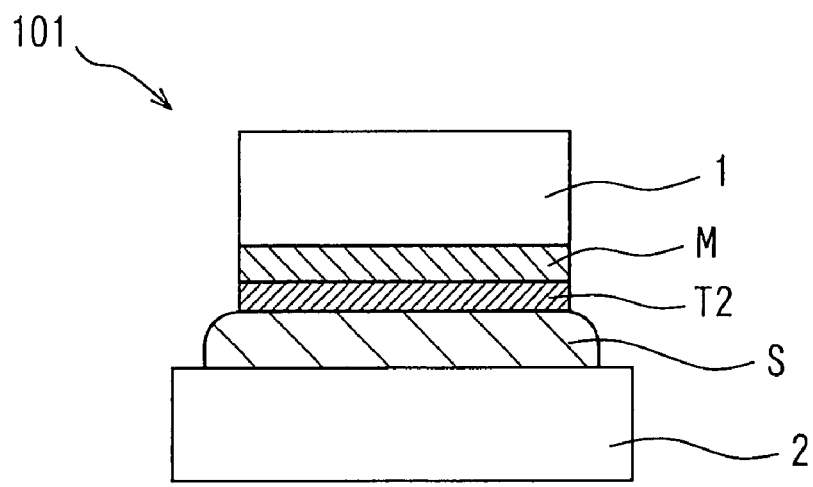

A semiconductor device 101 according to a second embodiment of the present invention is shown in FIGS. 6A to 6C. FIG. 6A shows the chip 10 before the first heat treatment, and FIG. 6B shows the chip 10 after the first heat treatment and the base member 2 before soldering. FIG. 6C shows the device 101 after the second heat treatment, i.e., after the soldering.

The device 101 is manufactured as follows. Firstly, the first metal layer M and the second metal layer N are formed on the backside of the substrate 1 in this order so that the semiconductor chip 10 is prepared. The chip 10 is firstly heated so that an intermediate alloy layer O is formed. The intermediate alloy layer O is composed of the first metal and the second metal alloy. The intermediate alloy layer O is disposed between the first and the second metal layers M, N. After this first heat treatment, the chip 10 is mounted on the base member 2 through the solder layer S. Then, the chip 10 with the base member 2 is heated secondary so that the chip 10 is soldered on the base member 2. Specifically, the second metal layer N is diffused into the solder layer S, and further, the intermediate alloy layer O is reacted to the solder layer S so that the second alloy layer T2 is formed. The second alloy layer T2 is composed of the first metal in the first metal layer M, the second metal in the second metal layer N and Sn in the solder layer S. After the second heat treatment, i.e., after the soldering, the device 101 includes the base member 2, the solder layer S, the second alloy layer T2, the first metal layer M and the substrate 1. Here, the second alloy layer T2 works as a bonding layer between the chip 10 and the base member 2.

In the device 101, the backside of the substrate 1 is bonded to the base member 2 by using the minimum number of the metal layers and the tin-based solder layer S. Therefore, a manufacturing process of the device 101 is simple, and a manufacturing cost of the device 101 is low.

Preferably, the second metal in the second metal layer N is Ni, Cu, Ag, Au, Pt, Ag—Pt alloy, Ag—Pd alloy or Pd. More preferably, the second metal is Ni or Au. The second metal can form alloy with Ti in a case where the first metal layer is made of Ti.

Next, the device 101 is manufactured, for example, as follows.

Firstly, the first metal layer M made of a Ti film having the thickness of 250 nm is formed on the backside of the substrate 1. Then, the second metal layer N composed of a Ni film having the thickness in a range between 50 nm and 600 nm and an Au film having the thickness of 50 nm is formed on the first metal layer M. Here, the second metal layer N is made of a multi-layered film. Thus, the chip 10 is prepared, and then, the chip is heated at 380° C. during three minutes. Then, the cross section of the chip 10 is studied. As a result, the intermediate alloy layer O having the thickness of 20 nm is formed between the first metal layer M and the second metal layer N.

Then, the solder layer S made of (99.24 wt. % Sn)-(0.7 wt. % Cu)-(0.06 wt. % Ni) alloy is formed on the base member 2 made of metal. Then, the chip 10 is mounted on the base member 2 through the solder layer S. Then, the chip 10 with the base member 2 is mounted in a hydrogen reduction atmospheric furnace. In the furnace, the chip 10 with the base member 2 is heated up to 270° C., which is higher than the solidus temperature of the solder layer S. Here, the solidus temperature is about 220° C. Thus, the chip 10 with the base member 2 is heated up to the peak temperature of 270° C. during 20 seconds so that the solder layer S is reflowed. In this second heat treatment process, i.e., in this soldering process, the chip 10 is soldered on the base member 2. After soldering, the second alloy layer T2 is formed. The second alloy layer T2 is made of Ti—Sn—Ni alloy.

Figure 7A:
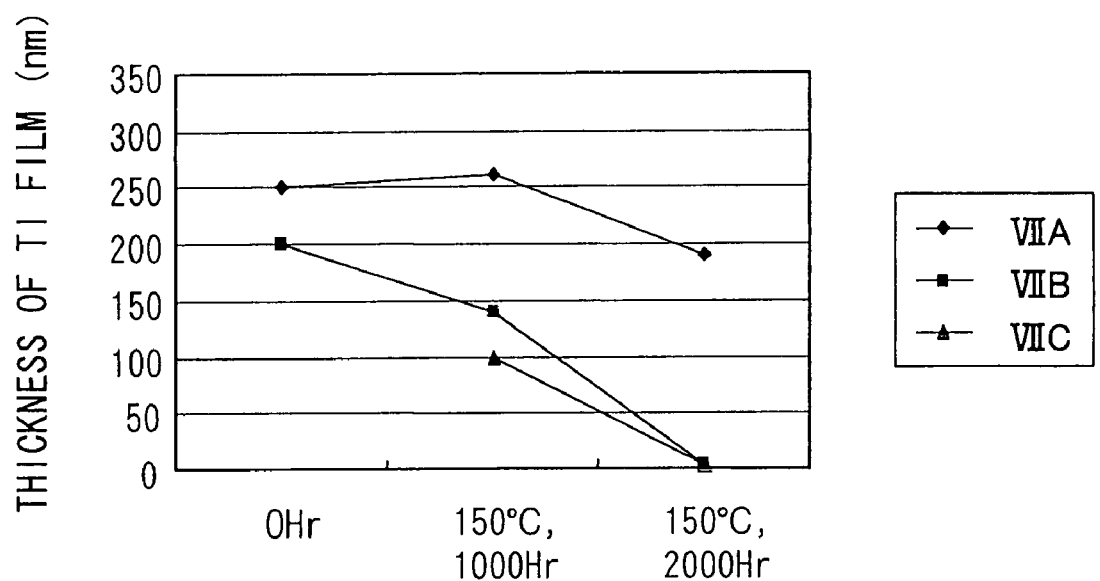
FIG. 7A is a graph showing time change of thickness of a Ti film under an endurance test in the device according to the first embodiment.
Figure 7B:
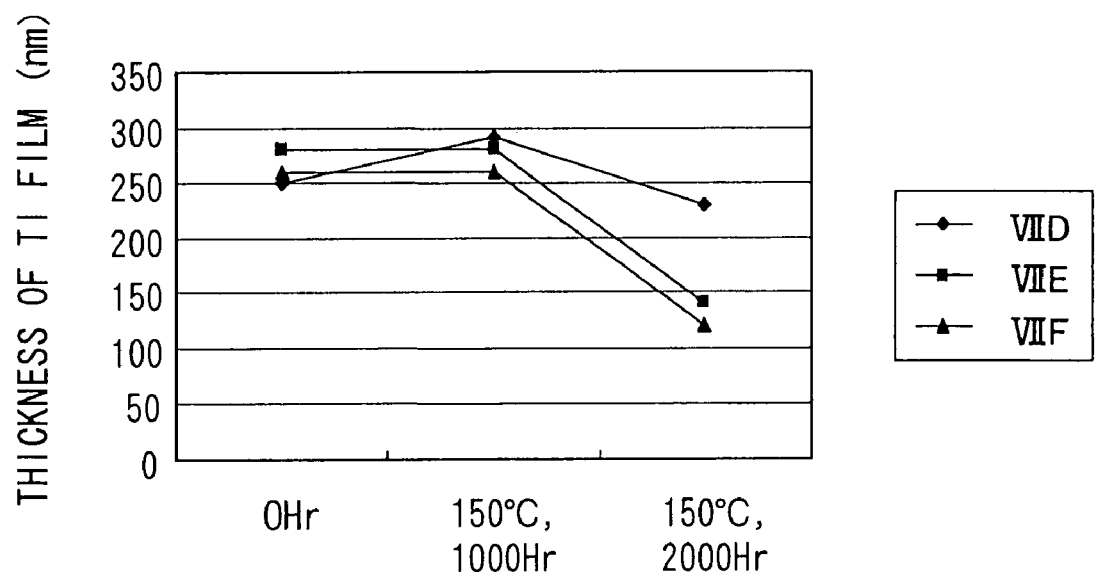
FIG. 7B is a graph showing time change of thickness of a Ti film under an endurance test in the device according to the second embodiment.
Figure 8A:
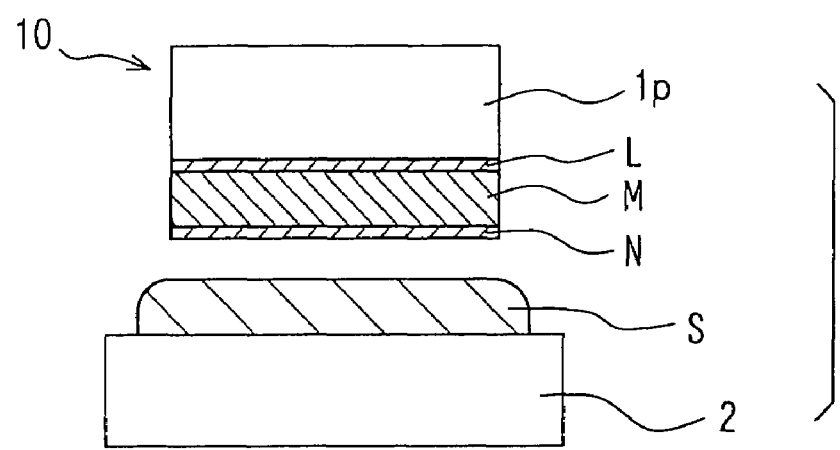
FIGS. 8A and 8B are schematic cross sectional views explaining a method for manufacturing a semiconductor device according to a modification of the first embodiment.
Figure 8B:
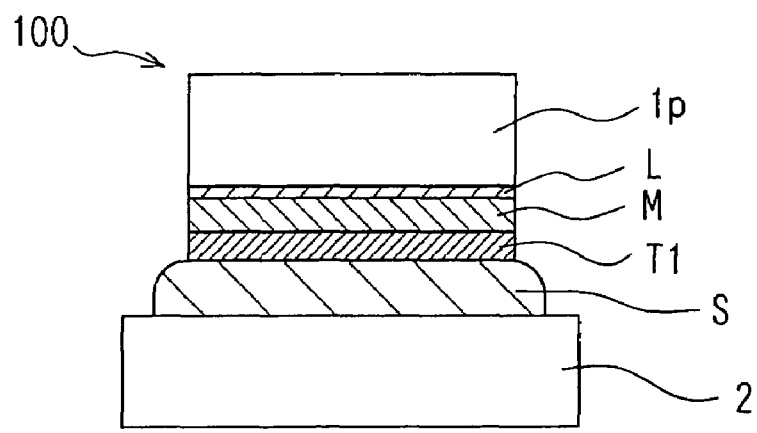
Figure 9A:
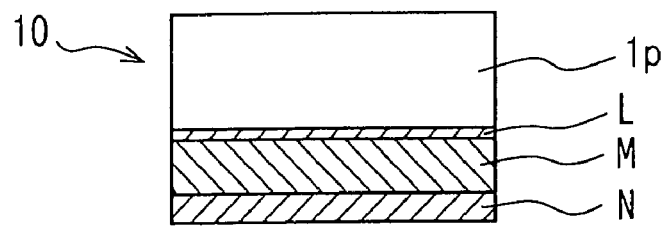
FIGS. 9A to 9C are schematic cross sectional views explaining a method for manufacturing a semiconductor device according to a modification of the second embodiment.
Figure 9B:
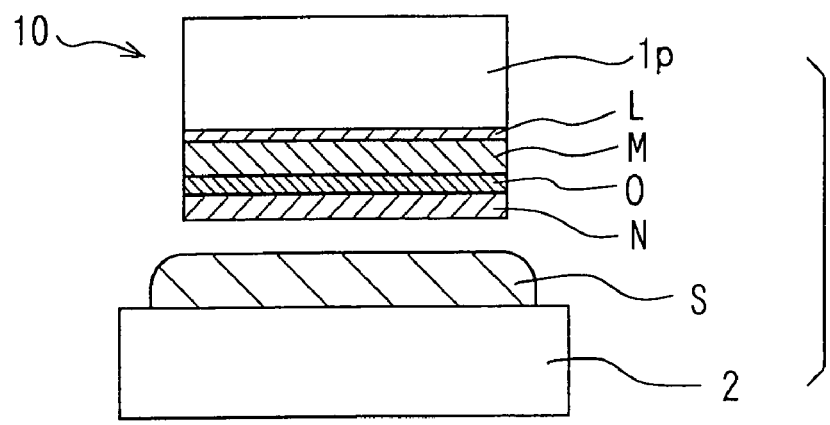
Figure 9C:
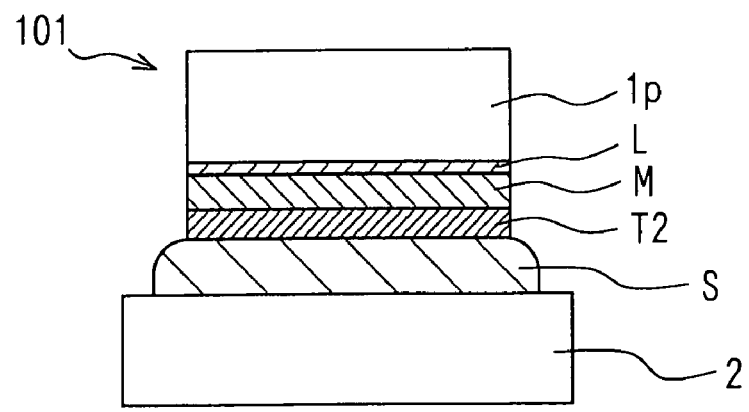

FIG. 7A shows time change of thickness of the Ti film of the first metal layer M in a case where the device 100 shown in FIG. 1B includes the first alloy layer T1 composed of the Ti—Sn alloy. FIG. 7B shows time change of thickness of the Ti film of the first metal layer M in a case where the device 101 shown in FIG. 6C includes the second alloy layer T2 composed of the Ti—Sn—Ni alloy. Here, the devices 100, 101 are performed under 150° C. endurance test during 0 hour, 1000 hours or 2000 hours. Here, 0 hour means that the devices 100, 101 are not performed under the endurance test. In FIG. 7A, a line VIIA represents the device 100 with the Ni film having the initial thickness of 600 nm before soldering, a line VIIB represents the device 100 with the Ni film having the initial thickness of 200 nm before soldering, and a line VIIC represents the device 100 with the Ni film having the initial thickness of 50 nm before soldering. In FIG. 7B, a line VIID represents the device 101 with the Ni film having the initial thickness of 600 nm before soldering, a line VIIE represents the device 101 with the Ni film having the initial thickness of 200 nm before soldering, and a line VIIF represents the device 101 with the Ni film having the initial thickness of 50 nm before soldering.

As shown in FIGS. 7A and 7B, in the device 101 having the second alloy layer T2, the time change of the thickness of the Ti film is comparatively small, compared with the device 100 having the first alloy layer T1. Therefore, in the device 101, Ti in the first metal layer M and Sn in the solder layer S are slowly reacted during a high temperature endurance test, compared with the device 100.

Modifications

The substrate 1 can be made of any semiconductor material. When the substrate 1 is made of a P conductive type semiconductor substrate 1p, it is preferred that the third metal layer L is formed between the first metal layer M and the substrate 1p, as shown in FIGS. 8A to 9C. The third metal layer L is made of aluminum based material. Preferably, the third metal layer L is made of pure aluminum (i.e., Al), aluminum-silicon (i.e., Al—Si) alloy, or aluminum-silicon-copper (i.e., Al—Si—Cu) alloy.

Figure 10:
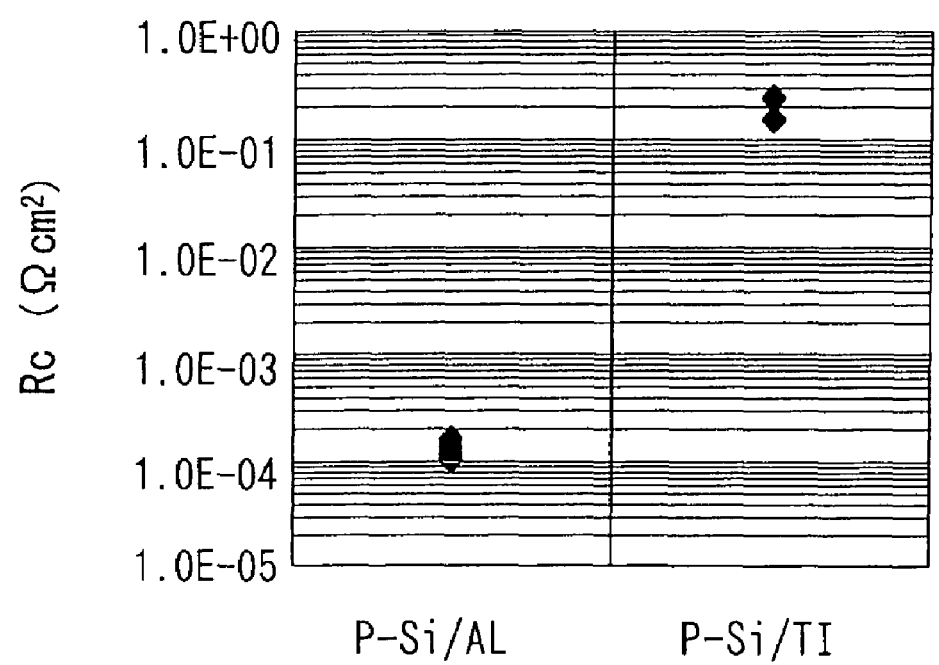
FIG. 10 is a graph showing a contact resistance between a P conductive type silicon substrate and an Al film or a Ti film, according to the modifications of the first and the second embodiments.

FIG. 10 shows a contact resistance between a P conductive type silicon substrate 1p and an Al layer or a Ti layer. The contact resistance between the P conductive type silicon substrate 1p and the Al layer is much lower than that between the P conductive type silicon substrate and the Ti layer. Specifically, the contact resistance of the Al layer is three orders of magnitude less than that of the Ti layer. Accordingly, the devices 100, 101 having the third metal layer L have excellent conductivity between the P conductive type semiconductor substrate 1p and the base member 2.

Although the chip 10 is bonded to the base member 2 by a solder reflow method in the hydrogen reduction atmospheric furnace, the chip 10 can be bonded to the base member 2 by using other soldering method such as a solder die bonding method with a wire solder and an air or an inert gas atmospheric reflow method with a solder paste.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device, which includes a semiconductor substrate and a base member bonded to the substrate with a tin-based solder layer, the method comprising the steps of:

forming a first metal layer on the substrate;

forming a second metal layer on the first metal layer;

stacking the substrate on the base member through the solder layer, wherein the solder layer is disposed between the base member and the second metal layer; and heating the substrate with the base member so that the second metal layer is diffused into the solder layer and that the first metal layer and the solder layer are reacted to form a first alloy layer, wherein the first alloy layer is made of a first metal in the first metal layer and tin in the solder layer, wherein the first alloy layer is disposed between the first metal layer and the solder layer, the first metal layer is made of at least one of material selected from the group consisting of titanium, aluminum, iron, molybdenum, chromium, vanadium and iron-nickel-chromium alloy, and the second metal layer has an initial thickness in a range between 50 nm and 750 nm before the step of heating.

2. The method according to claim 1, wherein
the tin-based solder layer is made of a lead free solder.

3. The method according to claim 2, wherein
the tin-based solder layer is made of at least one of material selected from the group consisting of tin, tin-copper alloy, tin-silver alloy, tin-silver-copper alloy, tin-copper-nickel alloy, tin-antimony alloy, tin-indium alloy, and tin-zinc alloy.

4. The method according to claim 3, wherein
the tin-based solder layer is made of at least one of material selected from the group consisting of pure tin, Sn-(0.7 wt. % Cu) alloy, Sn-(3.5 wt. % Ag) alloy, Sn-(1 wt. % to 3.9 wt. % Ag)-(0.3 wt. % to 1.5 wt. % Cu) alloy, and Sn-(0.7 wt. % Cu)-(0.06 wt. % Ni) alloy.

5. The method according to claim 2, wherein
the tin-based solder layer has a mass content of tin in the tin-based solder layer, the mass content which is equal to or larger than 95 wt. %.

6. The method according to claim 1, further comprising the step of:
heating the substrate with the first and the second metal layers so that an intermediate alloy layer is formed between the first and the second metal layers, wherein
the intermediate alloy layer is made of a first metal in the first metal layer and a second metal in the second metal layer,
in the step of heating the substrate with the base member, the intermediate alloy layer, the first metal layer and the solder layer are reacted to form a second alloy layer so that the first alloy layer becomes the second alloy layer, wherein the second alloy layer is made of the second metal in the second metal layer, the first metal in the first metal layer and the tin in the solder layer, and the second alloy layer is disposed between the first metal layer and the solder layer.

7. The method according to claim 6, wherein
the second metal is made of at least one of material selected from the group consisting of nickel, copper, silver, gold, platinum, silver-platinum alloy, silver-palladium alloy and palladium.

8. The method according to claim 7, wherein
the second metal is made of nickel or gold.

9. The method according to claim 1, wherein
the first and the second metal layers are serially formed in a vacuum chamber by a physical vapor deposition method.

10. The method according to claim 9, wherein
the vacuum chamber has an initial degree of vacuum equal to or smaller than $5 \times 10^{-4}$ Pa before forming the first and the second metal layers.

11. The method according to claim 1, further comprising the step of:
forming a third metal layer between the substrate and the first metal layer, wherein
the third metal layer is made of aluminum-based material.

12. The method according to claim 11, wherein
the third metal layer is made of at least one of material selected from the group consisting of pure aluminum, aluminum-silicon alloy, and aluminum-silicon-copper alloy.

13. The method according to claim 1, wherein
the first metal layer is made of titanium.

14. The method according to claim 1, wherein during the operation of heating the substrate, the second metal layer is substantially completely diffused into at least two of the solder layer, the first metal layer, and the second alloy layer.

15. The method according to claim 1, wherein during the operation of heating the substrate, the second metal layer is substantially completely diffused into the solder layer.

16. The method according to claim 1, wherein the operation of heating the substrate takes place at approximately 380° C.

* * * * *